US006847075B2

(12) United States Patent
Anezaki

(10) Patent No.: US 6,847,075 B2
(45) Date of Patent: Jan. 25, 2005

(54) SEMICONDUCTOR INTEGRATED CIRCUIT APPARATUS AND FABRICATION METHOD THEREOF

(75) Inventor: Toru Anezaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 65 days.

(21) Appl. No.: 10/449,930

(22) Filed: Jun. 3, 2003

(65) Prior Publication Data

US 2004/0004246 A1 Jan. 8, 2004

(30) Foreign Application Priority Data

Jul. 2, 2002 (JP) ........................................ 2002-193821

(51) Int. Cl.[7] ........................................... H01L 27/108

(52) U.S. Cl. ........................... 257/296; 257/68; 257/69; 257/71; 257/298; 257/306; 257/906

(58) Field of Search ..................... 257/68–71, 296–313, 257/905–908

(56) References Cited

U.S. PATENT DOCUMENTS 5,986,314 A * 11/1999 Seshadri et al. ............ 257/402

* cited by examiner

Primary Examiner—David Nelms
Assistant Examiner—Andy Huynh
(74) Attorney, Agent, or Firm—Westerman, Hattori, Daniels & Adrian, LLP

(57) ABSTRACT

A semiconductor integrated circuit apparatus having a planar capacitor can use a plurality of source voltages therein. According to the semiconductor integrated circuit apparatus, it is possible to not only control thresholds of individual MOS transistors but also reduce the threshold voltage of the planar capacitor without any additional fabrication process. The semiconductor integrated circuit apparatus includes a p-channel memory transistor and a capacitor in a first n-type element region, an n-channel low-voltage MOS transistor in a second p-type element region, and an n-channel high-voltage MOS transistor in a third p-type element region. A channel region of the second MOS transistor is doped under a high density profile by using a p-type impurity element. At the same time, the p-type impurity element is imported in a capacitor region of the first element region under the substantially same profile.

22 Claims, 13 Drawing Sheets

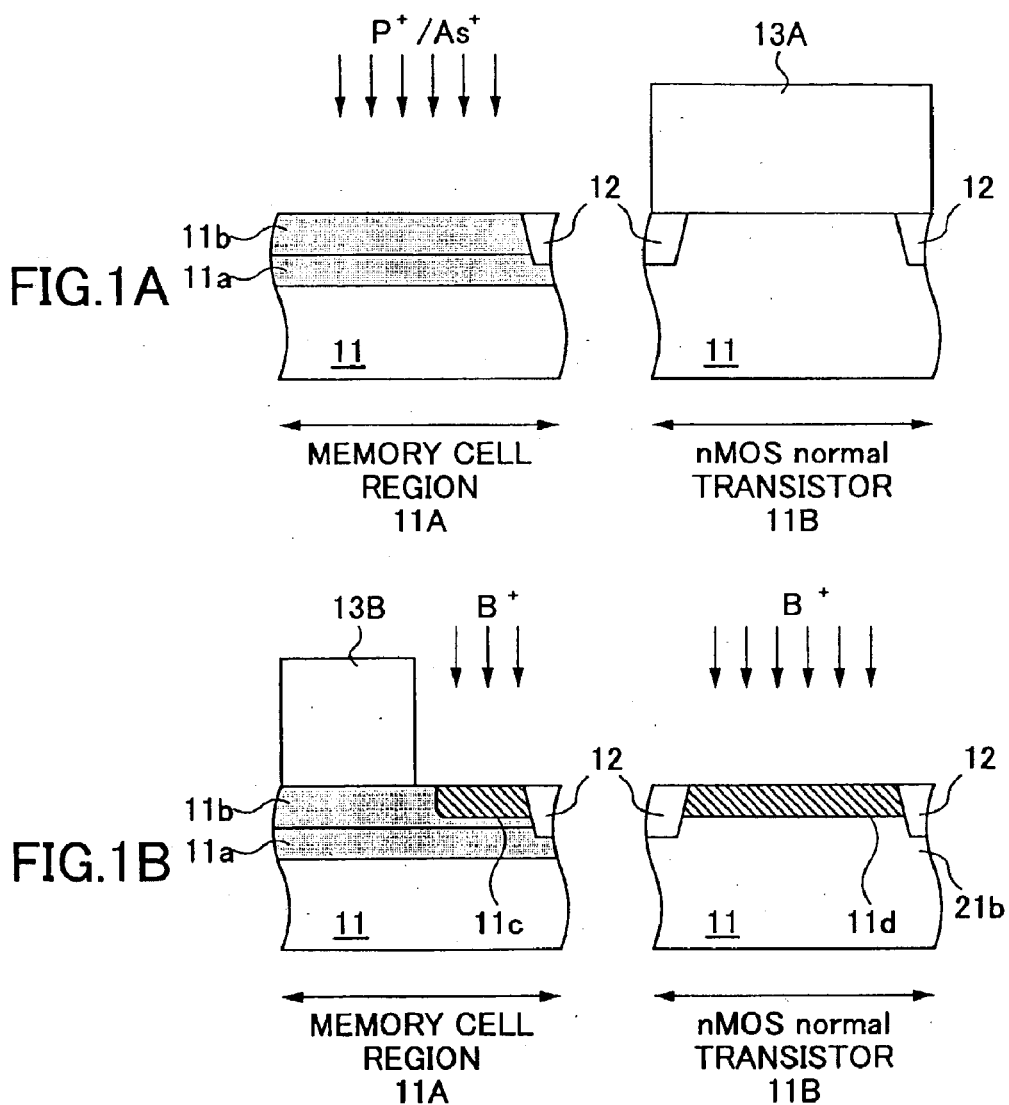

PRIOR ART
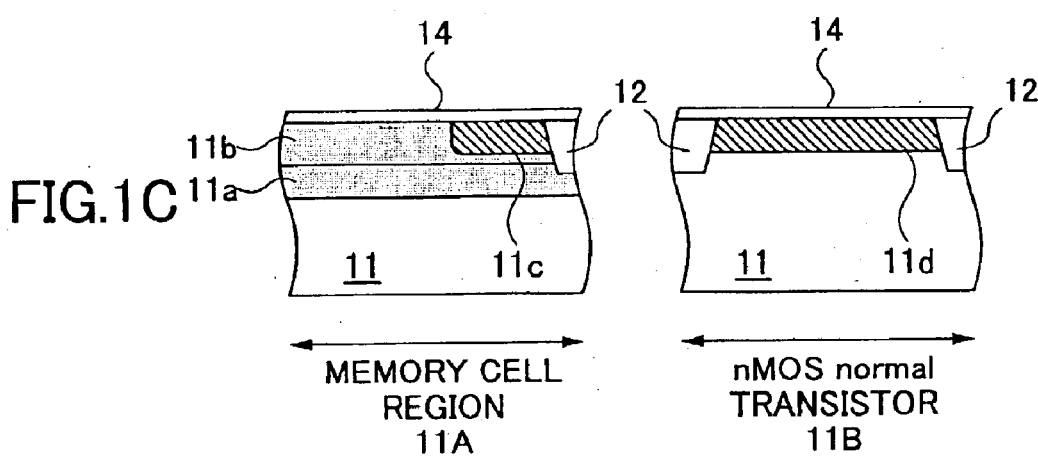
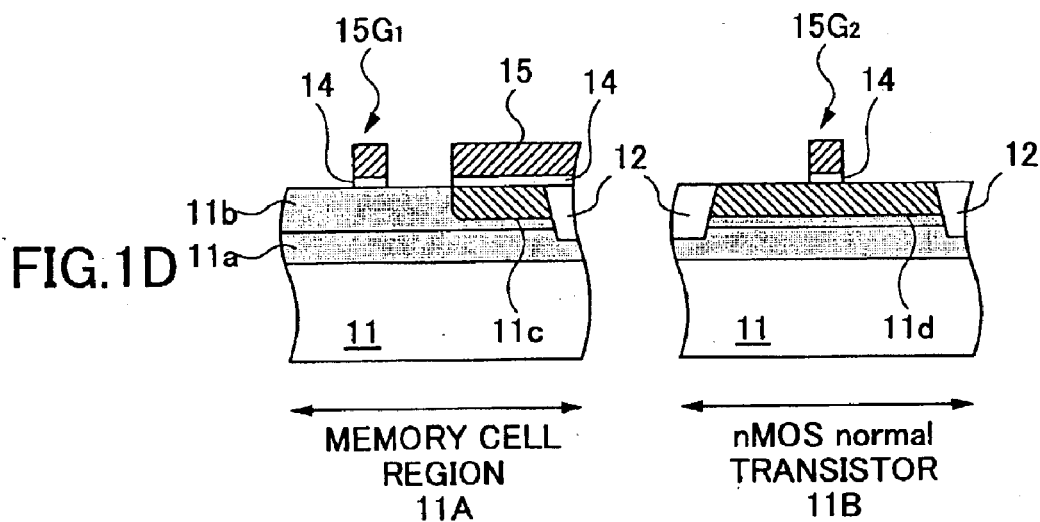

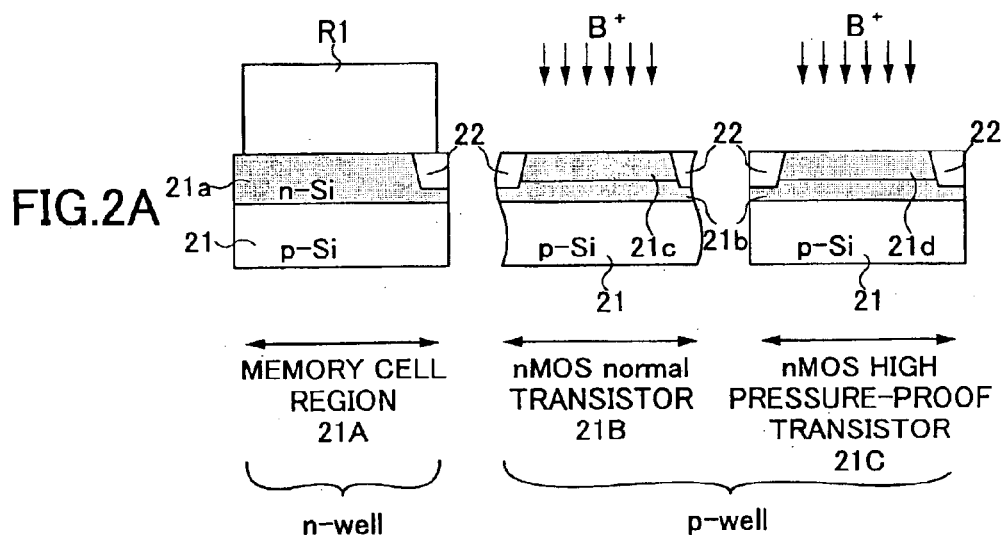
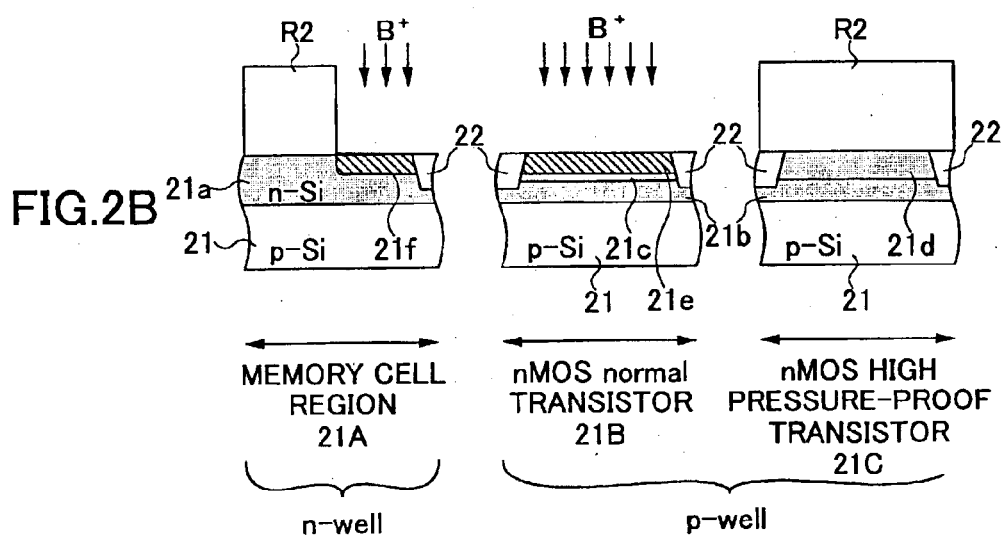

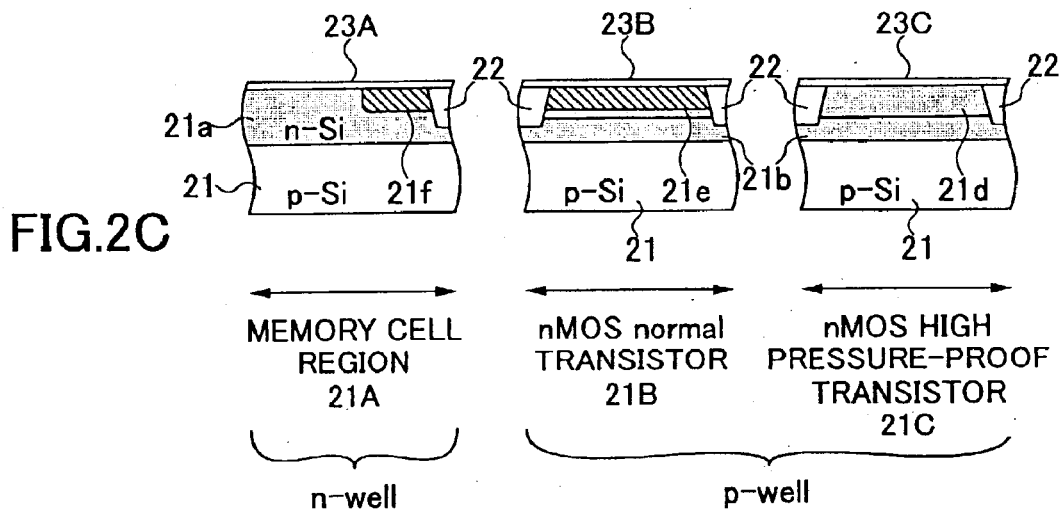
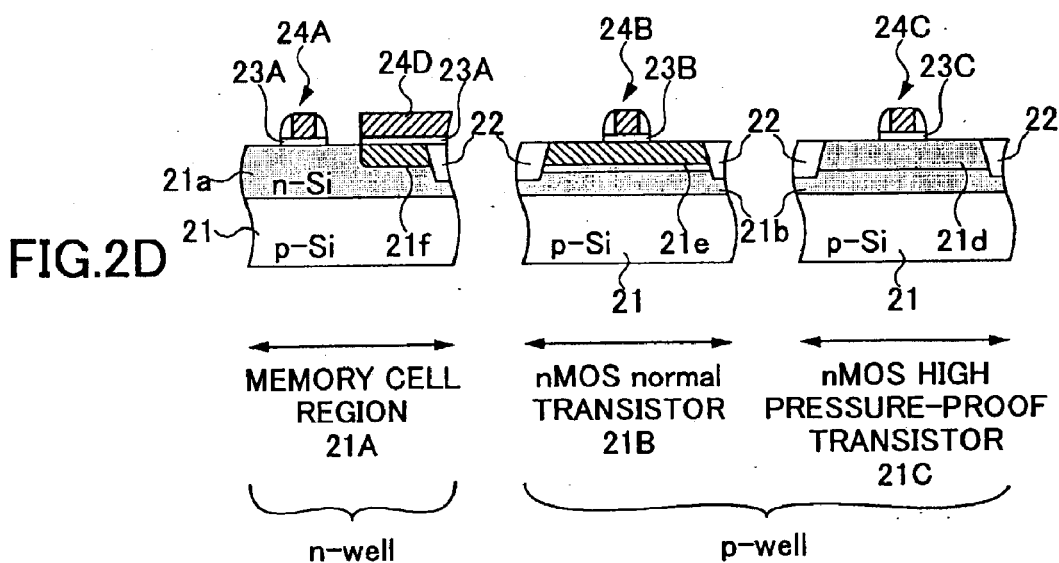

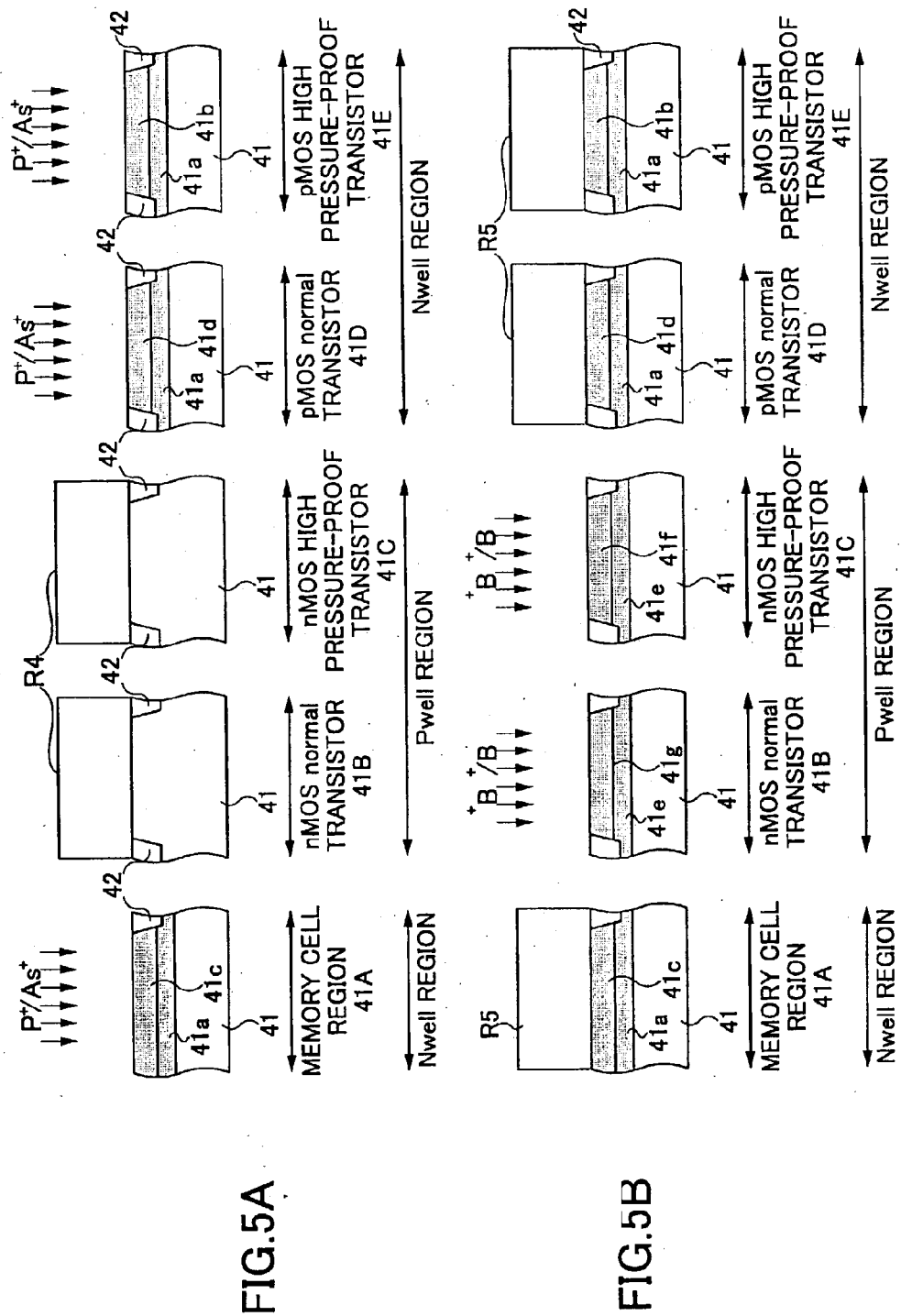

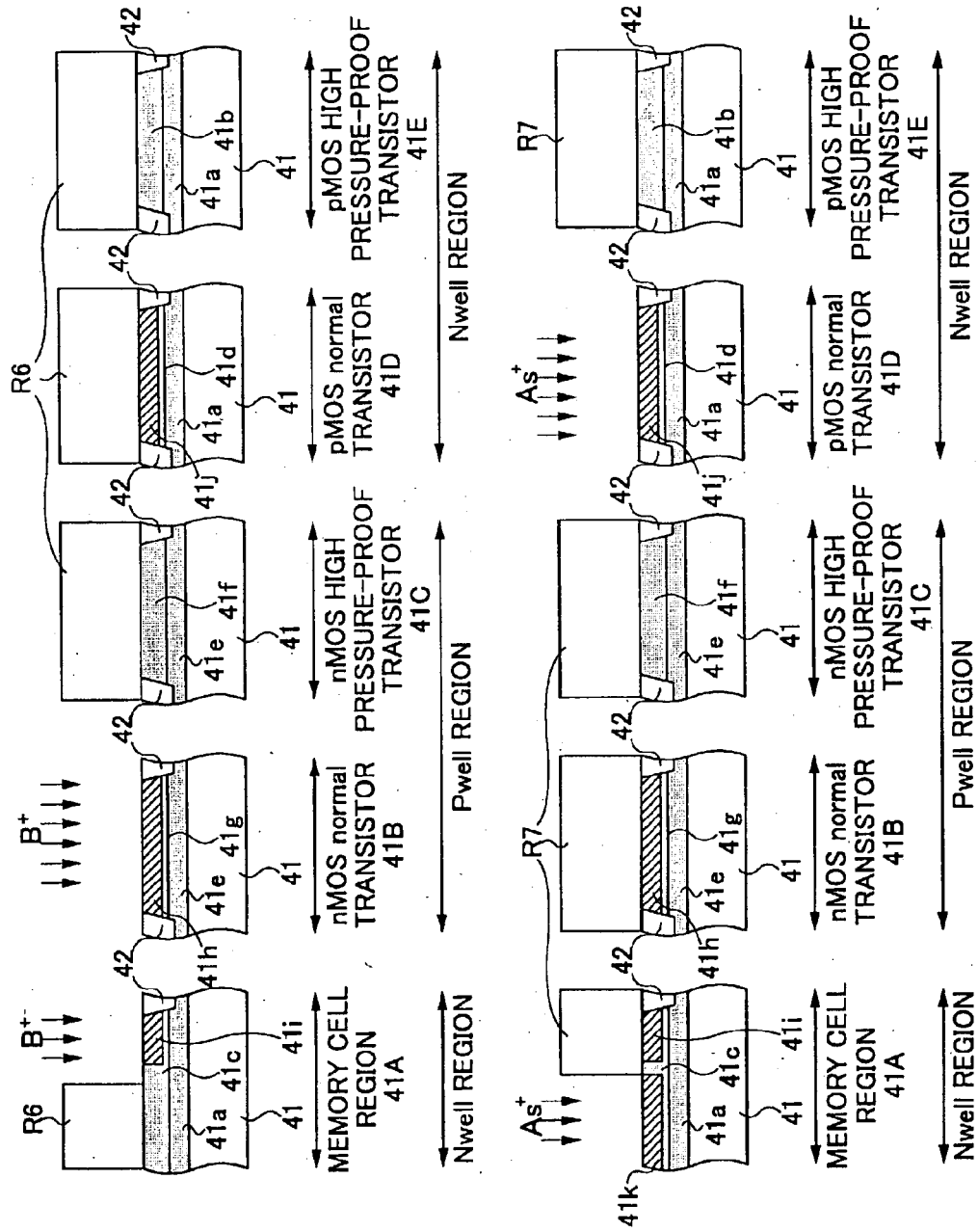

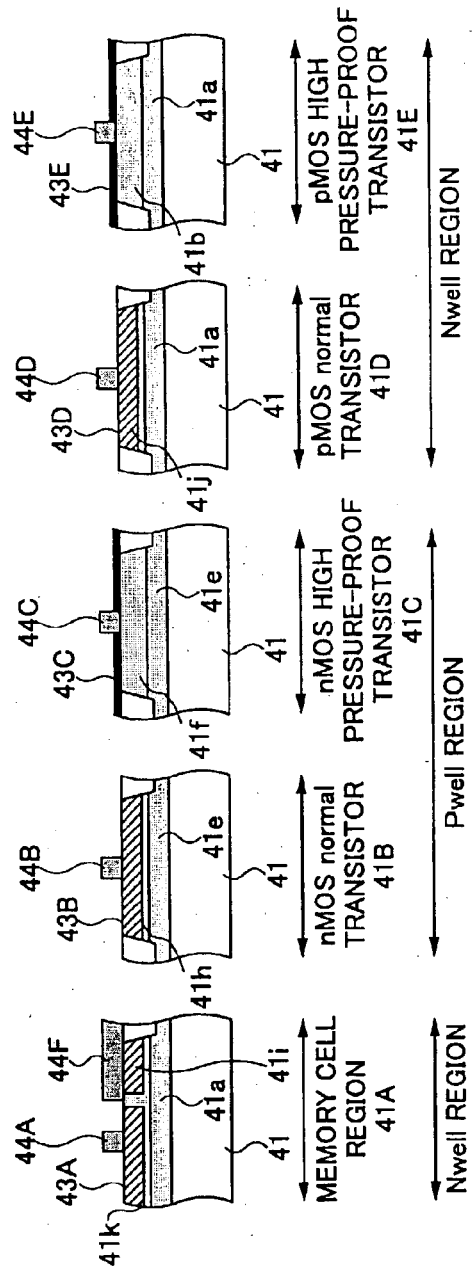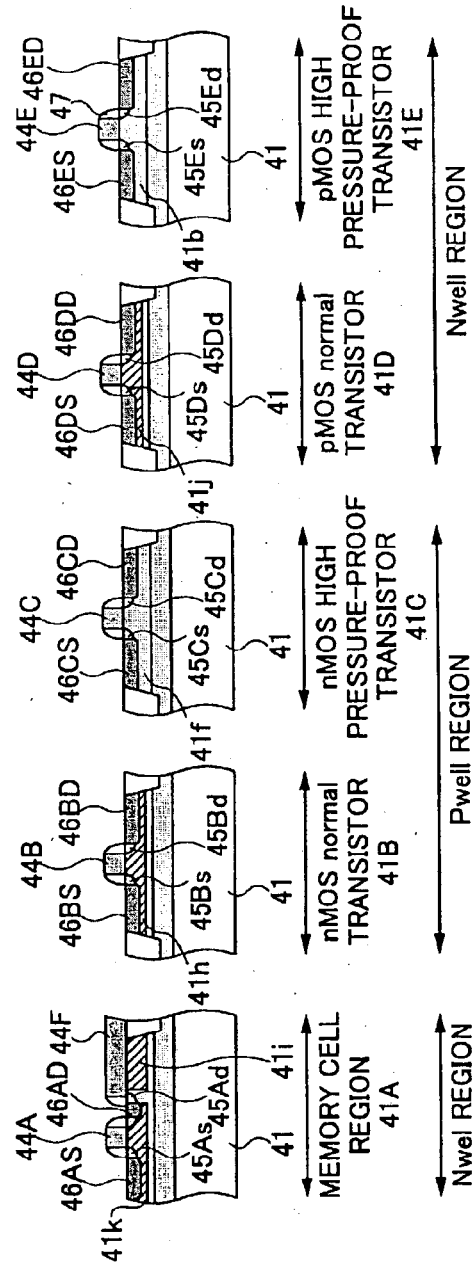
FIG.5E
FIG.5F

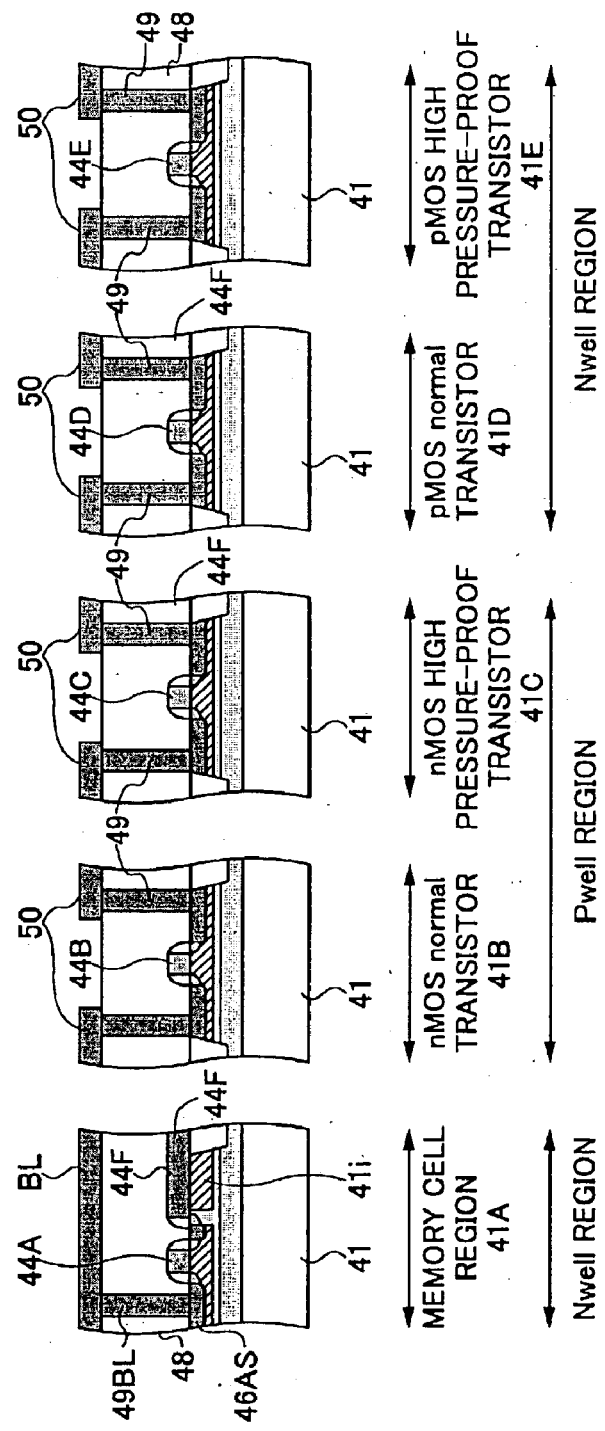

SEMICONDUCTOR INTEGRATED CIRCUIT APPARATUS AND FABRICATION METHOD THEREOF

CROSS-REFERENCE TO RELATED APPLICATIONS

The present application is based on Japanese priority application No. 2002-193821 filed Jul. 2, 2002, the entire contents of which are hereby incorporated by reference.

BACKGROUND OF THE INVENTION

1. Field of the Invention

The present invention generally relates to a semiconductor apparatus, and more particularly to a semiconductor apparatus that has a planar capacitor.

2. Description of the Related Art

There is a DRAM (Dynamic Random Access Memory) among fundamental semiconductor apparatuses. In general, the DRAM comprises a single transistor and a single capacitor. In particular, when a DRAM uses a planar capacitor as the capacitor, the structure of the planar DRAM is quite suitable to miniaturization. For this reason, such a planar DRAM is used as a semiconductor memory apparatus. Furthermore, it has been recently attempted to have the planar DRAM serve as a substitute for a high speed memory SRAM (Static Random Access Memory) in a high speed CMOS (Complementary Metal Oxide Semiconductor) logic circuit.

When a DRAM that includes a multi-layer structural capacitor such as a stack capacitor can be implemented in a reduced size, it is impossible to avoid an increase in the thermal budget and degradation of transistor characteristics. For this reason, such a stack capacitor type DRAM has disadvantages in terms of compatibility with a high speed CMOS logic circuit. On the other hand, a planar DRAM can be more easily integrated at a high integration density than a SRAM that includes 6 transistors. Additionally, since the planar DRAM does not use a multi-layer structural capacitor therein, it is possible to reduce the thermal budget. For these reasons, it is considered that the planar DRAM can be suitably used in a high speed CMOS logic circuit.

In a planar capacitor, a cell plate electrode is formed on a substrate via a capacitor insulation film. Here, if a voltage is applied to the cell plate electrode, an inverse layer is induced along a boundary surface between the substrate and the capacitor insulation film. At this time, the induced inverse layer is used as a storage electrode.

In this case, such a planar capacitor has a threshold voltage thereof. In order to drive the planar capacitor, it is necessary to apply a voltage higher than the threshold to the cell plate electrode.

Meanwhile, a current high speed CMOS logic integrated circuit has a CMOS logic element whose gate length is less than 0.18 μm and a gate oxide film whose thickness is less than 3 nm corresponding to the CMOS logic element. The high speed CMOS logic integrated circuit operates at a low voltage of about 1.5 V. On the other hand, the CMOS logic integrated circuit also includes a high voltage transistor driven at a voltage of 3.3 V, for example, an input-output circuit and so on. Therefore, it is preferable that a planar capacitor be formed in the CMOS logic integrated circuit without an increase in the number of fabrication steps, that is, a planar capacitor formed simultaneously with a fabrication process for forming a CMOS logic element and a high voltage element in the CMOS logic integrated circuit.

In a DRAM including a single planar capacitor and a single transfer transistor, it is necessary to satisfy the following condition so as to accumulate electric charge in the planar capacitor;

$$V_{cp}-(Vb1-Vth1)>Vth2,$$

where $V_{cp}$ is a voltage applied to an opposite electrode of the planar capacitor, $Vb1$ is a voltage for writing "1" in the planar capacitor, $Vth1$ is a threshold voltage of the transfer transistor, and $Vth2$ is a threshold voltage for forming an inversion layer on a boundary surface between a substrate and a capacitor insulation film of the DRAM. As seen from the condition, as the threshold voltage $Vth2$ is smaller, the voltage applied to the opposite electrode is allowed to have a wider range. As a result, it is possible to extend the freedom of DRAM design. Conventionally, ions of an impurity element are implanted into a substrate of a semiconductor in order to form a planar capacitor therein. For instance, U.S. Pat. No. 5,986,314 discloses a semiconductor fabrication method through such ion implantation.

A description will now be given, with reference to FIGS. 1A through 1D, of the above-mentioned conventional process for forming a planar DRAM, which comprises a planar capacitor and a transfer transistor, in an integrated circuit simultaneously with a process for providing other MOS (Metal Oxide Semiconductor) transistors in the integrated circuit.

Referring to FIGS. 1A through 1D, a memory cell region 11A and an nMOS (negative Metal Oxide Semiconductor) transistor region 11B are defined on a p-type Si substrate 11 by an element separation structure 12 such as an STI (SHALLOW Trench Isolation) structure. An n-type well 11a is formed in the memory cell region 11A through ion implantation with P (Phosphorus) by using a resist pattern 13A, which covers the nMOS transistor region 11B, as a mask.

Then, As (Arsenic) ions are implanted by using the resist pattern 13A as the mask. As a result, it is possible to form an n-type region 11b, which becomes a channel dope region of the transfer transistor to be formed, in the memory cell region 11A.

In a process in FIG. 1B, a resist pattern 13B is formed so as to cover a transistor formed region in the memory cell region 11A. Then, ions of a p-type impurity element such as B (Boron) are implanted into the memory cell region 11A and the nMOS transistor region 11B by using the resist pattern 13B as the mask. As a result, an n-type impurity region 11c of a low carrier density, which becomes a planar capacitor formed region, is formed in the memory cell region 11A. At the same time, a p-type region 11d, which becomes a channel dope region of the nMOS transistor region to be formed, is formed in the nMOS transistor region 11B.

In a thermal oxidation process in FIG. 1C, thermally oxidized films 14 are formed on the structure in FIG. 1B. In a process in FIG. 1D, a conductive film such as a polysilicon film is deposited on the thermally oxidized film 14. By patterning the conductive film, a gate electrode 15G1 and an electrode 15 are formed on the n-type region 11b in the memory cell region 11A and on the p-type region 11c, respectively. At the same time, a gate electrode 15G2 is formed on the p-type region 11d in the nMOS transistor region 11B. Here, the thermally oxidized films 14 under the gate electrodes 15G1 and 15G2 serve as gate insulation films.

Furthermore, if ions are implanted into the structure in FIG. 1D, which is not illustrated in FIG. 1D, by using the gate electrodes 15G1 and 15G2 as the masks so as to form a source region and a drain region, it is possible to form a transfer transistor in the memory cell region 11A and an nMOS transistor in the nMOS transistor region 11B.

In such a semiconductor apparatus, when a drive voltage is applied to the electrode 15 in FIG. 1D, an inversion layer is induced between the n-type region 11c and the thermally oxidized film 14. As a result, since the inversion layer is used as a storage electrode, it is possible to form a planar capacitor in the memory cell region 11A. Here, the electrode 15 serves as a cell plate electrode, and the p-type diffusion region 11c serves as a storage node. When the planar capacitor constructed in this fashion cooperates with the MOS transistor in the memory cell region, it is possible to provide a planar DRAM.

Meanwhile, as mentioned above, a recent CMOS logic circuit often includes not only a high speed CMOS element driven at a low voltage of about 1.2 V but also a high voltage element driven at a voltage of 3.3 V such as an input-output circuit. In a semiconductor integrated circuit apparatus using a plurality of source voltages in a single substrate, it is necessary to form gate insulation films that have various thicknesses in accordance with the source voltages. Also, it is necessary to use variable doses in a channel dope region in accordance with the source voltages.

Consequently, it is expected to design a semiconductor integrated circuit apparatus fabrication method for forming a semiconductor apparatus having a planar capacitor, typically, a planar DRAM in a semiconductor integrated circuit apparatus using a plurality of source voltages without an increase in the fabrication steps. However, according to the above-mentioned conventional semiconductor integrated circuit apparatus fabrication method, it is impossible to produce such a semiconductor integrated circuit apparatus using a plurality of source voltages without any additional step.

Furthermore, according to the conventional semiconductor integrated circuit apparatus fabrication method, a MOS transistor, which is one part of a DRAM, is formed of an nMOS transistor. However, since the nMOS transistor uses electrons as the carrier, the nMOS transistor is vulnerable to soft errors due to radiation. For this reason, it is desirable to use a pMOS transistor as a memory cell transistor in the DRAM because the pMOS transistor uses holes having larger effective mass as the carrier. In particular, this property of the pMOS transistor is strongly required for a planar DRAM because of a small capacity thereof. However, no semiconductor fabrication method that can overcome the above-mentioned problems has been proposed. Namely, there is currently no semiconductor fabrication method for forming a planar DRAM using a pMOS transistor as a memory cell transistor integrally with a semiconductor integrated circuit apparatus in which a plurality of source voltages are used and a high speed logic circuit is included without any additional processes.

SUMMARY OF THE INVENTION

It is a general object of the present invention to provide a novel and useful semiconductor apparatus fabrication method and a semiconductor apparatus fabricated thereby in which the above-mentioned problems are eliminated.

A more specific object of the present invention is to provide a semiconductor apparatus fabrication method that can form a planar DRAM including a logic element or a semiconductor element including other capacitors in a fabrication process of a semiconductor integrated circuit apparatus using a plurality of source voltages such as a logic integrated circuit apparatus without any additional processes thereof, and a semiconductor apparatus fabricated thereby.

In order to achieve the above-mentioned objects, there is provided according to one aspect of the present invention a semiconductor integrated circuit apparatus, comprising: a substrate; a first element region being formed on the substrate, the first element region having a first conductive type; a second element region being formed on the substrate, the second element region having a second conductive type; a third element region being formed on the substrate, the third element region having the second conductive type; a first MOS transistor being formed in a transistor region of the first element region, the first MOS transistor having a second conductive type channel; a capacitor being formed in a capacitor region of the first element region; a second MOS transistor being formed on the second element region, the second MOS transistor having a first gate insulation film of a first film thickness and a first conductive type channel; and a third MOS transistor being formed on the third element region, the third MOS transistor having a second gate insulation film of a second film thickness greater than the first film thickness and a first conductive type channel, wherein the third MOS transistor has a channel region channel-doped under a first profile by using a second conductive type impurity element, the second MOS transistor has a channel region channel-doped under a second profile, which is a higher density profile, by using a second conductive type impurity element, and the second conductive type impurity element is imported in the capacitor region in the first element region under a profile substantially identical to a subtraction of a channel dope of the third MOS transistor from a channel dope of the second MOS transistor so as to form a diffusion region that serves as a lower electrode of the capacitor.

In the above-mentioned semiconductor integrated circuit apparatus, the diffusion region may have the first conductive type and a carrier density of the diffusion region may be lower than a carrier density of the first element region.

In the above-mentioned semiconductor integrated circuit apparatus, the second element region may contain a fourth MOS transistor having a gate insulation film of the first film thickness and the first conductive type channel, and the third element region may contain a fifth MOS transistor having a gate insulation film of the second film thickness and the first conductive type channel.

Additionally, there is provided according to another aspect of the present invention a semiconductor integrated circuit apparatus, comprising: a substrate; a first element region being on the substrate, the first element region having a first conductive type; a second element region being on the substrate, the second element region having the first conductive type; a third element region being on the substrate, the third element region having the first conductive type; a first MOS transistor being formed on a transistor region of the first element region, the first MOS transistor having a second conductive type channel; a capacitor being formed in a capacitor region of the first element region; a second MOS transistor being formed on the second element region, the second MOS transistor having a first gate insulation film of a first film thickness and a second conductive type channel; a third MOS transistor being formed on the third element region, the third MOS transistor having a second gate insulation film of a second film thickness greater than the first film thickness and a second conductive type channel, wherein the third MOS transistor has a channel region channel-doped under a first profile by using a first conductive type impurity element, the second MOS transistor has a channel region channel-doped under a second profile, which is a higher density profile, by using a first conductive type impurity element, and the first conductive type impurity element is imported in the capacitor region in the first element region under a profile substantially identical to a channel dope of the third MOS transistor so as to form a diffusion region that serves as a lower electrode of the capacitor.

In the above-mentioned semiconductor integrated circuit apparatus, the first MOS transistor may be a p-channel MOS transistor.

In the above-mentioned semiconductor integrated circuit apparatus, the capacitor may include a capacitor insulation film formed so as to cover the capacitor region and a capacitor electrode formed on the capacitor insulation film, and the capacitor insulation film may have a film thickness substantially equal to the first film thickness of the first gate insulation film.

In the above-mentioned semiconductor integrated circuit apparatus, the diffusion region, which serves as the lower electrode of the capacitor, may have the first conductive type, and a carrier density of the diffusion region may be lower than a carrier density of the channel region of the first MOS transistor.

In the above-mentioned semiconductor integrated circuit apparatus, the first MOS transistor and the capacitor may constitute a DRAM.

Additionally, there is provided according to another aspect of the present invention a fabrication method of a semiconductor integrated circuit apparatus comprising: a substrate; a first element region being formed on the substrate, the first element region having a first conductive type; a second element region being formed on the substrate, the second element region having a second conductive type; a third element region being formed on the substrate, the third element region having a second conductive type; a first MOS transistor being formed in a transistor region of the first element region, the first MOS transistor having a second conductive type channel; a capacitor being formed in a capacitor region of the first element region; a second MOS transistor being formed on the second element region, the second MOS transistor having a first gate insulation film of a first film thickness and a first conductive type channel; and a third MOS transistor being formed on the third element region, the third MOS transistor having a second gate insulation film of a second film thickness greater than the first film thickness and a first conductive type channel, the fabrication method comprising the steps of: importing a second conductive type impurity element in the second element region and the third element region selectively, and conducting a channel-doping for a channel region of the third MOS transistor; importing the second conductive type impurity element in the capacitor region in the first element region and the second element region, and conducting a channel-doping for a channel region of the second MOS transistor in the second element region and a diffusion region, which serves as a lower electrode of the capacitor, corresponding to the capacitor region in the first element region; and forming the first MOS transistor in the transistor region of the first element region, the capacitor in the capacitor region of the first element region, the second MOS transistor in the second element region, and the third MOS transistor in the third element region, wherein the step of forming the second MOS transistor includes a step of forming the first gate insulation film of the first film thickness, the step of forming the third MOS transistor includes the second gate insulation film of the second film thickness, the step of forming the diffusion region, which serves as the lower electrode in the capacitor region, in the first element region is performed simultaneously with the step of conducting a channel-doping for the channel region of the second MOS transistor in the second element region, and the second conductive type impurity element is imported in the second element region simultaneously with the step of conducting a channel-doping for the channel region of the third MOS transistor.

Additionally, the above-mentioned fabrication method may further comprise a step of importing a first conductive type impurity element in the first element region such that the first conductive type impurity element is not imported in the capacitor after the step of conducting a channel-doping for the channel region of the second MOS transistor before the step of forming the first through the third MOS transistors.

In the above-mentioned fabrication method, the substrate may further contain a fourth element region having the first conductive type, and the first conductive type impurity element may be further imported in the fourth element region simultaneously with the step of importing the first conductive type impurity element in the first element region.

In the above-mentioned fabrication method, the substrate may further contain a fifth element region having the first conductive type, and the first conductive type impurity element may be imported in the first, the fourth and the fifth element regions before the step of conducting a channel-doping for the channel region of the third MOS transistor.

Additionally, there is provided according to another aspect of the present invention a fabrication method of a semiconductor integrated circuit apparatus comprising: a substrate; a first element region being on the substrate, the first element region having a first conductive type; a second element region being on the substrate, the second element region having the first conductive type; a third element region being on the substrate, the third element region having the first conductive type; a first MOS transistor being formed in a transistor region in the first element region, the first MOS transistor having a second conductive type channel; a capacitor being formed in a capacitor region in the first element region; a second MOS transistor being formed in the second element region, the second MOS transistor having a first gate insulation film of a first film thickness and a second conductive type channel; a third MOS transistor being formed in the third element region, the third MOS transistor having a second gate insulation film of a second film thickness greater than the first film thickness and a second conductive type channel, the fabrication method comprising the steps of: importing a first conductive type impurity element in the first, the second and the third element regions, forming a diffusion region, which serves as a lower electrode of the capacitor, in the first element region, and conducting a channel-doping for a channel region of the third MOS transistor in the third element region, the channel region having the first conductive type; importing the first conductive type impurity element in the transistor region of the first element region and the second element region, and conducting a channel-doping for a channel region of the first MOS transistor in the transistor region and a channel region of the second MOS transistor in the second element region; and forming the first MOS transistor in the transistor region in the first element region, the capacitor in the capacitor region, the second MOS transistor in the second element region, and the third MOS transistor in the third element region, wherein the step of forming the second MOS transistor includes a step of forming the first gate insulation film of the first film thickness, the step of forming the third MOS transistor includes a step of forming the second gate insulation film of the second film thickness, the step of forming the diffusion region in the first element region is performed simultaneously with the step of conducting the channel-doping for the channel region of the third MOS transistor in the third element region, and the step of conducting the channel-doping for the channel region of the first MOS transistor in the first element region is performed simultaneously with the step of conducting the channel-doping for the channel region of the second MOS transistor in the second element region.

Additionally, there is provided according to another aspect of the present invention a fabrication method of a semiconductor integrated circuit apparatus comprising: a substrate; a first element region being formed on the substrate, the first element region having a first conductive type; a second element region being formed on the substrate, the second element region having a second conductive type; a third element region being formed on the substrate, the third element region having the second conductive type; a fourth element region being formed on the substrate, the fourth element region having the first conductive type; a fifth element region being formed on the substrate, the fifth element region having the first conductive type; a first MOS transistor being formed in a transistor region in the first element region, the first MOS transistor having the second conductive type; a capacitor being formed in a capacitor region in the first element region; a second MOS transistor being formed in the second element region, the second MOS transistor having a first gate insulation film of a first film thickness and a first conductive type channel; a third MOS transistor being formed in the third element region, the third MOS transistor having a second gate insulation film of a second film thickness greater than the first film thickness and a first conductive type channel; a fourth MOS transistor being formed in the fourth element region, the fourth MOS transistor having a third gate insulation film of a third film thickness and a second conductive type channel; a fifth MOS transistor being formed in the fifth element region, the fifth MOS transistor having a fourth gate insulation film of a fourth film thickness greater than the third film thickness and a second conductive type channel, the fabrication method comprising the steps of: importing a first conductive type impurity element in the first, the fourth and the fifth element regions selectively, and forming a diffusion region, which serves as a lower electrode of the capacitor, in the capacitor region in the first element region, and conducting a channel-doping for a channel region of the fifth MOS transistor in the fifth element region, the channel region having a first conductive type; importing a second conductive type impurity element in the second and the third element regions selectively, and conducting a channel-doping for a channel region of the third MOS transistor; importing a first conductive type impurity element in the capacitor region in the first element region and the second element region selectively, and conducting a channel-doping for the diffusion region, which serves as the lower electrode of the capacitor, corresponding to the capacitor region in the first element region and the channel region of the second MOS transistor in the second element region; importing a first conductive type impurity element in the transistor region of the first element region and the fourth element region, and conducting a channel-doping for a channel region of the first MOS transistor in the transistor region and a channel region of the fourth MOS transistor in the fourth element region; and forming the first MOS transistor in the transistor region in the first element region, the capacitor in the capacitor region, the second MOS transistor in the second element region, the third MOS transistor in the third element region, the fourth MOS transistor in the fourth element region, and the fifth MOS transistor in the fifth element region, wherein the step of forming the second MOS transistor includes a step of forming the first gate insulation film of the first film thickness, the step of forming the third MOS transistor includes a step of forming the second gate insulation film of the second film thickness, the step of forming the fourth MOS transistor includes a step of forming the third gate insulation film of the first film thickness, the step of forming the fifth MOS transistor includes a step of forming the fifth gate insulation film of the second film thickness, and the step of forming the diffusion region, which serves as the lower electrode of the capacitor, in the first element region is performed simultaneously with the step of conducting the channel-doping for the channel region of the fourth MOS transistor in the fourth element region.

According to the above-mentioned inventions, the diffusion region in the first element region is formed simultaneously with the channel-doping process for the second MOS transistor or the channel-doping process for the third MOS transistor. As a result, it is possible to form a capacitor in a semiconductor integrated circuit apparatus using a plurality of source voltages without an increase in the process steps. Furthermore, since the semiconductor integrated circuit apparatus has gate insulation films whose film thicknesses are different from each other, it is possible to control threshold voltages of the second and the third MOS transistors whose driving voltages are different from each other through ion implantation into the capacitor. Therefore, it is possible to simplify the fabrication process of the semiconductor integrated circuit apparatus.

In particular, when a well dope and a channel dope are adjusted in a low-voltage MOS transistor and a high-voltage transistor, it is possible to change a threshold voltage of the capacitor without any additional process.

Other objects, features and advantages of the present invention will become more apparent from the following detailed description when read in conjunction with the accompanying drawings.

BRIEF DESCRIPTION OF THE DRAWINGS

FIGS. 1A through 1D are diagrams for explaining a conventional fabrication process of a semiconductor integrated circuit apparatus having a planar capacitor;

FIGS. 2A through 2E are diagrams for explaining a fabrication process of a semiconductor integrated circuit apparatus according to a first embodiment of the present invention;

FIGS. 5A through 5G are diagrams for explaining a fabrication process of a semiconductor integrated circuit apparatus according to a third embodiment of the present invention.

DETAILED DESCRIPTION OF THE PREFERRED EMBODIMENTS

Figure 2E:
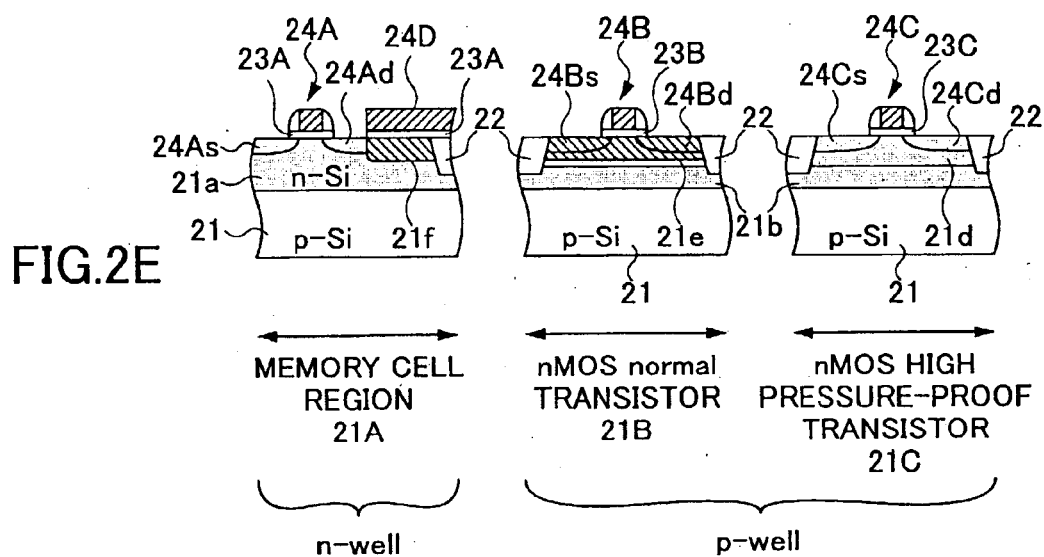

In the following, embodiments of the present invention will be described with reference to the accompanying drawings.

A description will now be given, with reference to FIGS. 2A through 2E, of a semiconductor integrated circuit apparatus according to the first embodiment of the present invention.

FIGS. 2A through 2E show a fabrication process of the semiconductor integrated circuit apparatus according to the first embodiment.

Referring to FIGS. 2A through 2E, element regions 21A through 21C are defined on a p-type Si substrate 21 by an element separation structure 22 such as an STI structure. The element region 21A has an n-type well 21a.

In a process in FIG. 2A, a resist pattern R1 covers the element region 21A having the n-type well 21a. When ions of a p-type impurity element such as B are implanted into the element regions 21A through 21C, for instance, at an acceleration voltage of 300 keV with a dose of $3 \times 10^{12}$ ions/cm$^2$ by using the resist pattern R1 as a mask, it is possible to form p-type wells 21b in the element regions 21B and 21C. Subsequently, when the ions of the p-type impurity element are implanted at an acceleration voltage of 50 keV with the dose of $3 \times 10^{12}$ ions/cm$^2$, it is possible to form a p-type region 21d having a predetermined impurity density near the surface of the substrate in the p-type well 21b in the element region 21C. As mentioned later, a high pressure-proof nMOS transistor is to be formed in the p-type region 21d.

At the same time, a p-type region 21c having the same impurity density as the p-type region 21d is formed in the element region 21B where a low voltage driven nMOS transistor is to be formed.

In a process in FIG. 2B, a resist pattern R2 covers the element region 21C. When ions of a p-type impurity element such as B are implanted, for instance, at an acceleration voltage of 30 keV with a dose of $1 \times 10^{13}$ ions/cm$^2$ by using the resist pattern R2 as the mask, it is possible to dope a channel of the nMOS transistor to be formed in the element region 21B. As a result, it is possible to form a p-type region 21e having a predetermined impurity density higher than that of the p-type region 21d in the element region 21C, in the element region 21B.

Furthermore, in the process in FIG. 2B, the resist pattern R2 covers a portion of the memory cell region 21A so as to expose the other portion. Accordingly, the above implanted B ions are also implanted into the exposed portion in the memory cell region 21A. In this process, when the B ions are implanted into the portion of the n-type well 21a in the memory cell region 21A under the substantially same profile as the p-type region 21e, it is possible to preferably form an n-type diffusion region 21f having a decreased carrier density in the portion of the memory cell region 21A. Here, the diffusion region 21f may be an n-type region having a low carrier density.

In a process in FIG. 2C, the resist pattern R2 is removed. Then, oxidized films 23A through 23C are formed on the element regions 21A through 21C, respectively. In this process, the oxidized films 23A and 23B are simultaneously formed to have an equal film thickness. On the other hand, the oxidized film 23C is formed to have a film thickness greater than the others. In order to form such oxidized films whose thicknesses differ from each other, for instance, thick oxidized films are simultaneously formed on the element regions 21A through 21C. Then, oxidized films are removed from the element regions 21A and 21B through an etching process in a state where a resist mask covers the oxidized film 23C on the element region 21C. After that, the resist mask is removed from the element region 21C, and an oxidation process is carried out for the resulting substrate.

As a result, it is possible to make the oxidized films 23A and 23B thinner than the oxidized film 23C. In this fashion, it is possible to simultaneously form the oxidized films 21A and 21B having the substantially equal thickness, which is less than that of the oxidized film 21C.

In a process in FIG. 2D, gate electrodes 24A through 24C are formed on the element regions 21A through 21C via the insulation films 23A through 23C, respectively. Additionally, an electrode 24D is formed on the diffusion region 21f via the insulation film 23A. Here, the electrode 24D, the insulation film 23A and the diffusion region 21f constitute a planar capacitor.

In a process in FIG. 2E, ions of a p-type impurity element are implanted into the element region 21A in FIG. 2D by using the gate electrodes 24A and 24D as the masks. Then, a p-type source region 24As and a p-type drain region 24Ad are formed in the element region 21A. Namely, it is possible to form a pMOS transistor, which comprises the gate electrode 24A, the p-type source region 24As and the p-type drain region 24Ad, in the element region 21A. Here, since the p-type drain region 24Ad extends to the diffusion region 21f, the pMOS transistor is electrically connected to the planar capacitor via the drain region 24Ad and the diffusion region 21f. Thus, it is possible to obtain a planar DRAM that comprises the pMOS transistor and the planar capacitor.

Figure 3:
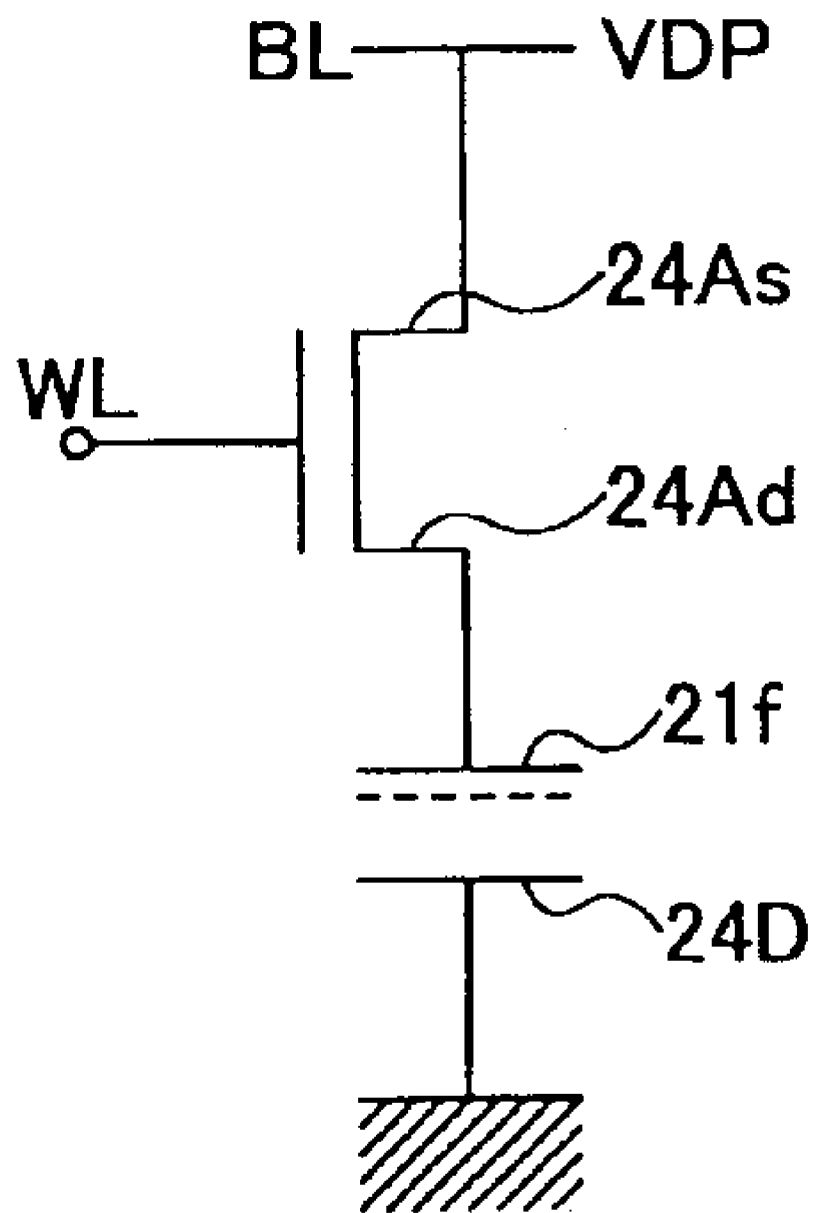
FIG. 3 is an equivalent circuit diagram of a DRAM having a planar capacitor fabricated in the semiconductor integrated circuit apparatus fabrication process according to the first embodiment.

FIG. 3 shows an equivalent circuit diagram of the planar DRAM formed in the element region 21A in the above-mentioned fashion.

Referring to FIG. 3, the pMOS transistor of the planar DRAM is connected to a bit line BL having a negative potential at the source region 24As and is grounded at the cell plate electrode 24D.

In this configuration, an inversion layer, which comprises holes, is formed in the n-type diffusion region 21f, which serves as a storage node, on a boundary surface between the insulation film 23A and the n-type diffusion region 21f. As a result, it is possible to form a valid planar capacitor including the diffusion region 21f, the cell plate electrode 24D and the insulation film 23A.

In the DRAM, ions of not only the n-type impurity element but also the p-type impurity element are implanted into the diffusion region 21f under the insulation film 23A in the process in FIG. 2B. As a result, it is possible to form the inversion layer on the boundary surface between the diffusion region 21f and the insulation film 23A at a lower threshold voltage applied to the electrode 24D. As a result, it is possible to form the inversion layer by applying a slight voltage.

In the process in FIG. 2E, since ions of As or P are further implanted into the element regions 21B and 21C, it is possible to obtain an n-type source region 24Bs and an n-type drain region 24Bd at opposing sides of the gate electrode 24B in the p-type channel dope region 21e and an n-type source region 24Cs and an n-type drain region 24Cd at opposing sides of the gate electrode 24C in the p-type channel dope region 21d. At this time, an LDD (Lightly Doped Drain) region may be formed according to a conventional technique. In this case, it is possible to form an n-channel MOS transistor including a peripheral circuit of the DRAM or a high speed logic element in the element region 21B. On the other hand, it is possible to form a high pressure-proof n-channel MOS transistor, that is, an n-channel MOS transistor driven by a high source voltage, in the element region 21C.

According to the semiconductor integrated circuit apparatus fabrication process according to the first embodiment, the thresholds of both the planar capacitor and the MOS transistor in the element region 21B can be simultaneously controlled as seen in FIG. 2B. As a result, it is possible to optimally control the thresholds for the individual MOS transistors in the element regions 21A through 21C.

Regarding the semiconductor integrated circuit apparatus fabrication process according to the first embodiment, although the above-mentioned description handles the case where the DRAM memory cell transistor is the p-channel MOS transistor, the DRAM memory cell transistor may be an n-channel MOS transistor. In this case, p-channel MOS transistors are formed in the element regions 21B and 21C through ion implantation with reverse-conductive ions.

A description will now be given, with reference to FIG. 4A through 4E, of a semiconductor integrated circuit apparatus fabrication process according to the second embodiment of the present invention.

FIGS. 4A through 4E show a fabrication process of the semiconductor integrated circuit apparatus according to the second embodiment.

Referring to FIGS. 4A through 4E, element regions 31A through 31C are defined on a p-type Si substrate 31 by an element separation structure 32 such as an STI structure. In a process in FIG. 4A, P ions are uniformly implanted into the element regions 31A through 31C, for instance, at an acceleration voltage of 500 keV with a dose of $3 \times 10^{12}$ ions/cm$^2$. As a result, an n-type well 31a is formed in each of the element regions 31A through 31C. Subsequently, As ions are uniformly implanted into the element regions 31A through 31C, for instance, at an acceleration voltage of 150 keV with a dose of $5 \times 10^{12}$ ions/cm$^2$. As a result, it is possible to form n-type regions 31b having a predetermined impurity density near the surface of the substrate 31 in the n-type wells 31a in the element regions 31A through 31C. As mentioned later, high pressure-proof nMOS transistors are to be formed in the n-type regions 31b.

Figure 4A:
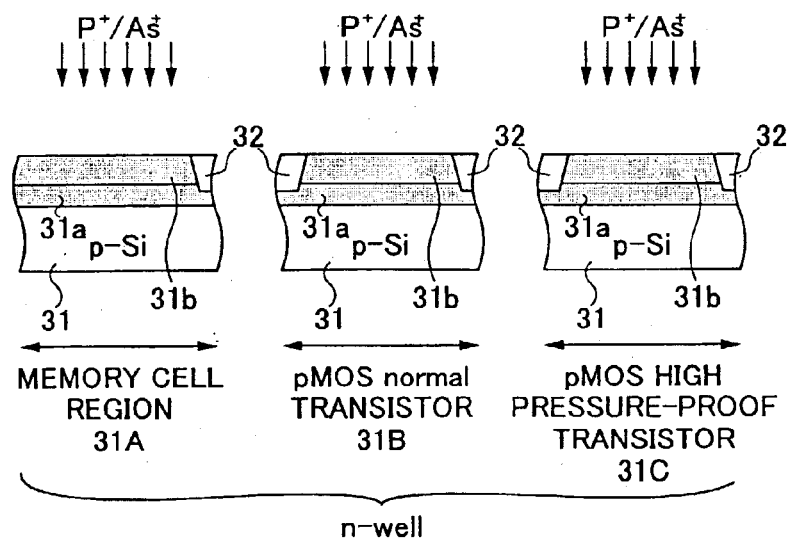
FIGS. 4A through 4E are diagrams for explaining a fabrication process of a semiconductor integrated circuit apparatus according to a second embodiment of the present invention.
Figure 4B:
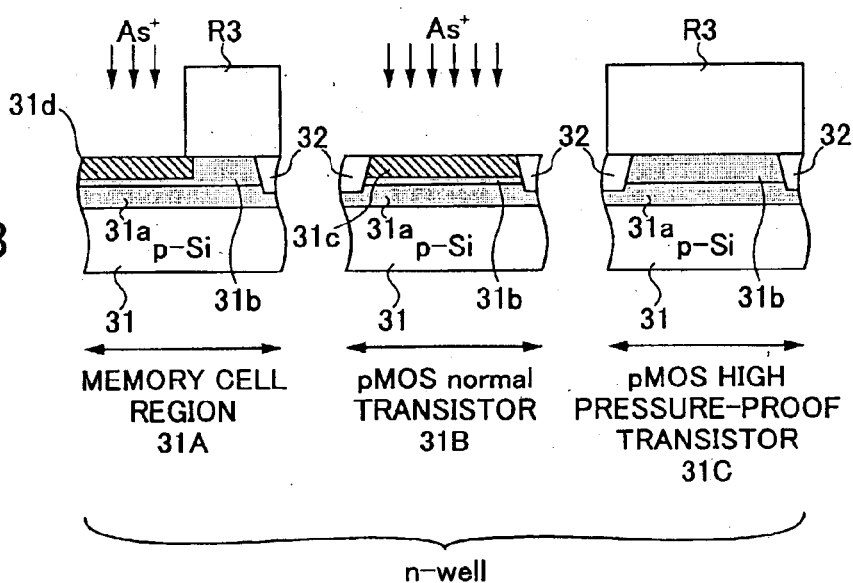

In a process in FIG. 4B, a resist pattern R3 is provided so as to protect the element regions 31A and 31C. Then, As ions are implanted at an acceleration voltage of 50 keV with a dose of $2 \times 10^{13}$ ions/cm$^2$. As a result, it is possible to obtain an n-type region 31c, which becomes a channel region of a pMOS transistor to be formed in the element region 31B, near the surface of the n-type region 31b in the element region 31B. Namely, in this process, it is possible to dope the channel region of the pMOS transistor to be formed in the element region 31B.

At the same time, a portion of the element region 31A is exposed as shown in FIG. 4B. Here, As ions are also implanted into the exposed portion under the same density and profile as the above As ion implantation process. As a result, it is possible to form an n-type region 31d whose carrier density is higher than the n-type region 31b in the element region 31A corresponding to the channel region of the pMOS transistor to be formed therein. Here, the n-type region 31d has the same carrier density as the n-type region 31c in the element region 31B.

Figure 4C:
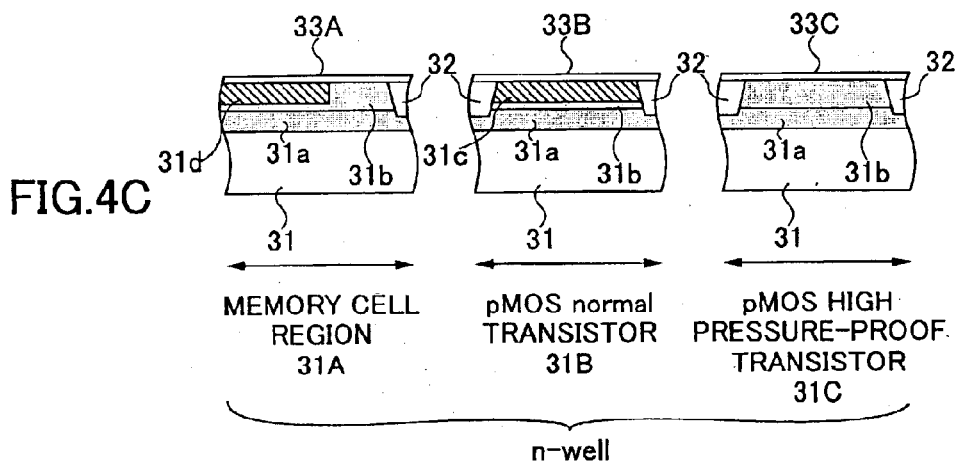

In a process in FIG. 4C, the resist pattern R3 is removed from the element regions 31A and 31C. Furthermore, oxidized films 33A through 33C, which serve as insulation films, are formed on the element regions 31A through 31C, respectively. In this process, the oxidized films 33A and 33B are simultaneously formed to have a substantially equal film thickness. On the other hand, the oxidized film 33C is formed to have a greater thickness than the others.

Figure 4D:
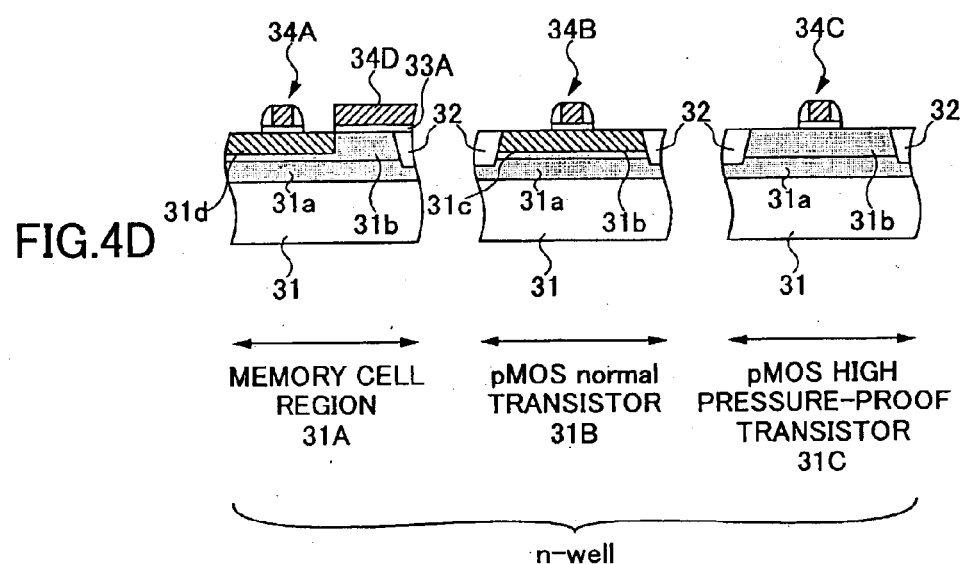

In a process in FIG. 4D, gate electrodes 34A through 34C are formed on the element regions 31A through 31C via insulation films 33A through 33C, respectively. Furthermore, a capacitor electrode 34D is formed on the diffusion region 31b in the element region 31A via the insulation film 33A. Here, the capacitor electrode 34D, the insulation film 33A and the diffusion region 31b constitute a planar capacitor.

Figure 4E:
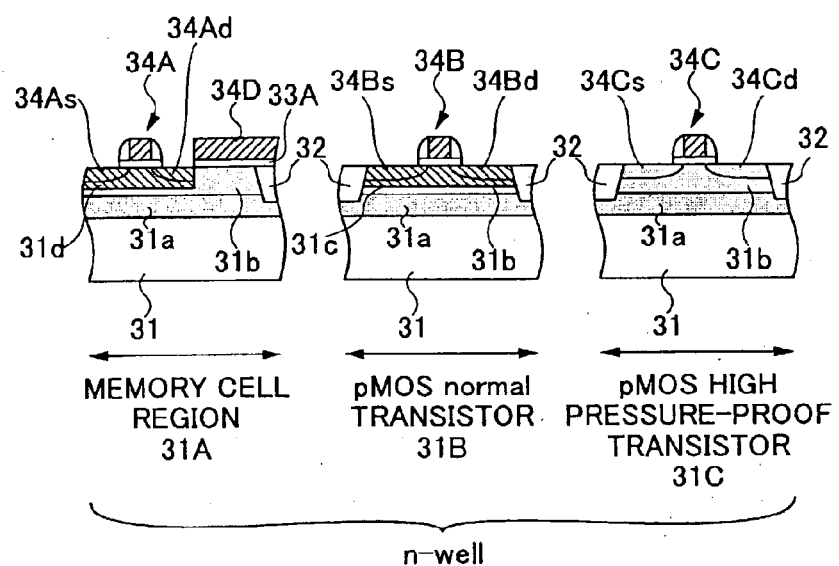

In a process in FIG. 4E, ions of a p-type impurity element are implanted into the element region 31A in FIG. 4D by using the gate electrode 34A and the capacitor electrode 34D as the masks. As a result, it is possible to form a p-type source region 34As and a p-type drain region 34Ad in the element region 31A. Namely, it is possible to obtain a pMOS transistor, which comprises the gate electrode 34A, the p-type source region 34As and the p-type drain region 34Ad, in the element region 31A. Here, since the p-type drain region 34Ad extends to the diffusion region 31b, the pMOS transistor is electrically connected to the planar capacitor via the drain region 34Ad and the diffusion region 31b. As a result, it is possible to obtain a planar DRAM that comprises the pMOS transistor and the planar capacitor.

In the process in FIG. 4E, furthermore, if B ions are implanted into the element regions 31B and 31C, it is possible to form a p-type source region 34Bs and a p-type drain region 34Bd at opposing sides of the gate electrode 34B in the n-type channel dope region 31b in the element region 31B and a p-type source region 34Cs and a p-type drain region 34Cd at opposing sides of the gate electrode 34C in the n-type channel dope region 31c in the element region 31C. At this time, an LDD region may be formed according to a conventional technique. In this case, it is possible to provide a p-channel MOS transistor including a peripheral circuit of the DRAM or a high speed logic element in the element region 31B. On the other hand, it is possible to provide a high pressure-proof p-channel MOS transistor, that is, a p-channel MOS transistor driven by a high source voltage, in the element region 31C.

According to the above-mentioned planar DRAM, the diffusion region 31b under the capacitor insulation film 33A has the same carrier density as the n-type channel dope region 31b in the element region 31C. As a result, it is possible to form an inversion layer on the boundary surface between the diffusion region 31b and the insulation film 33A by applying a slight voltage to the electrode 34D.

In the semiconductor integrated circuit apparatus fabrication process according to the second embodiment, thresholds of the planar capacitor and the high pressure-proof pMOS transistor in the element region 31C are simultaneously controlled in the process in FIG. 4A. Also, when the threshold of the low voltage p-channel MOS transistor in the element region 31B is controlled in the process in FIG. 4B, it is possible to simultaneously control a threshold of the p-channel MOS transistor in the element region 31A, which is a part of a transfer transistor in the element region 31A. As a result, it is possible to optimally control the thresholds of the MOS transistors in the element regions 31A through 31C without any additional process.

In the semiconductor integrated circuit apparatus according to the second embodiment, since the PMOS transistor in the element region 31A can be used as a MOS transistor of a DRAM memory cell transistor similarly to the first embodiment, it is possible to provide the semiconductor integrated circuit apparatus that has highly tolerance to soft errors.

A description will now be given, with reference to FIGS. 5A through 5G, of a fabrication process of a semiconductor integrated circuit apparatus according to the third embodiment of the present invention.

FIGS. 5A through 5G show the fabrication process of the semiconductor integrated circuit apparatus according to the third embodiment.

Referring to FIGS. 5A through 5G, a memory cell region 41A, an element region 41B where an nMOS transistor, a part of a CMOS logic element, is to be formed, an element region 41C where a high pressure-proof nMOS transistor is to be formed, an element region 41D where a pMOS transistor, another part of the CMOS logic element, is to be formed, and an element region 41E where a high pressure-proof pMOS transistor is to be formed are defined on a p-type Si substrate 41 by an element separation structure 42 such as an STI structure.

In a process in FIG. 5A, a resist pattern R4 covers the element regions 41B and 41C. In order to form an n-type well 41a, P ions are implanted into the element regions 41A, 41D and 41E, for instance, at an acceleration voltage of 500 keV with a dose of $3 \times 10^{12}$ ions/cm$^2$ by using the resist pattern R4 as the mask.

Furthermore, As ions are implanted into the element regions 41A, 41D and 41E, for instance, at an acceleration voltage 150 keV with a dose of $5 \times 10^{12}$ ions/cm$^2$ by using the resist pattern R4 as the mask in order to conduct a channel-doping for a pMOS high pressure-proof transistor, which is to be formed in the element region 41E, in the n-type well 41a in the element region 41E. As a result, it is possible to form an n-type channel-doped region 41b near the surface of the n-type well 41a in the element region 41E. At the same time, it is possible to form n-type regions 41c and 41d having an equal density near the surface of the n-type well 41a in the element regions 41A and 41D, respectively.

In a process in FIG. 5B, a resist pattern R5 covers the element regions 41A, 41D and 41E. In order to form a p-type well 41e in the element regions 41B and 41C, B ions are implanted, for instance, at an acceleration voltage 300 keV with a dose of $3 \times 10^{12}$ ions/cm$^2$ by using the resist pattern R5 as the mask.

Subsequently, B ions are implanted, for instance, at an acceleration voltage 50 keV with a dose of $3 \times 10^{12}$ ions/cm$^2$ by using the resist pattern R5 as the mask in order to conduct a channel-doping for an nMOS high pressure-proof transistor in the p-type well 41e in the element region 41C. As a result, it is possible to form a p-type channel-doped region 41f near the surface of the p-type well 41e in the element region 41C. At the same time, it is possible to form a p-type region 41g having the same density near the surface of the p-type well 41e in the element region 41B.

In a process in FIG. 5C, a resist pattern R6 covers the element regions 41C, 41D and 41E. In order to conduct a channel-doping for an nMOS transistor, which is to be formed in the element region 41B, in the p-type region 41g in the element region 41B, B ions are implanted into the element regions 41C, 41D and 41E, for instance, at an acceleration voltage of 30 keV with a dose of $1 \times 10^{13}$ ions/cm$^2$ by using the resist pattern R6 as the mask. As a result, it is possible to form a p-type channel-doped region 41h near the surface of the p-type region 41g in the element region 41B.

In this process, the resist pattern R6 also covers a transistor region in the element region 41A so as to expose a capacitor region. Here, if B ions are implanted into the capacitor region in the element region 41A under the same density and profile simultaneously with the above-mentioned channel-doping process, it is possible to form an n-type diffusion region or a p-type diffusion region 41i in a part of the n-type region 41c.

In a process in FIG. 5D, a resist pattern R7 covers the element regions 41B, 41C and 41E together with the diffusion region 41i in the element regions 41A. In order to conduct a channel-doping for a pMOS transistor in the n-type region 41d in the element region 41D, As ions are implanted, for instance, at an acceleration voltage 150 keV with a dose of $2 \times 10^{13}$ ions/cm$^2$ by using the resist pattern R7 as the mask. At the same time, a channel-doping is conducted for a pMOS transistor in the transistor region in the element region 41A under the same density and profile. As a result, it is possible to form n-type channel-doped regions 41j and 41k near the surfaces of the n-type regions 41d and 41c in the element regions 41D and 41A, respectively.

In this process, if distinct masks are used to carry out the ion implantation into the element regions 41D and 41A, it is possible to obtain pMOS transistors whose threshold characteristics differ from each other.

In a process in FIG. 5E, silicon oxidized films 43C and 43E, for instance, of 6 nm in thickness are formed in the element regions 41C and 41E, respectively. Furthermore, thinner silicon oxidized films 43A, 43B and 43D, for instance, of 3 nm in thickness are formed on the element regions 43A, 43B and 43D, respectively. In order to form such oxidized films each of which has a film thickness different from each other, for instance, silicon oxidized films are formed to have the thickness of 6 nm through a thermal oxidation process for the element regions 41A through 41E. Subsequently, the silicon oxidized films are removed from the element regions 41A, 41B and 41D. Then, silicon oxidized films are formed to have the thickness of 3 nm through a thermal oxidation process. In this fashion, it is possible to obtain oxidized films having different film thicknesses.

Furthermore, a polysilicon film is deposited on the obtained structure so that the film thickness can be 200 nm. If the polysilicon film is patterned, it is possible to form gate electrodes 44A through 44E in the element regions 41A through 41E, respectively. At the same time, an electrode 44F, which serves as a cell plate, is formed on the diffusion region 41i via the silicon oxidized film 43A.

In a process in FIG. 5F, P ions are implanted into the element regions 41B and 41C, for instance, at an acceleration voltage 15 keV with a dose of $1 \times 10^{14}$ ions/cm$^2$ by using the gate electrodes 44B and 44C as the masks. As a result, it is possible to form an n-type source extension region 45Bs and an n-type drain extension region 45Bd at opposing sides of the gate electrode 44B in the p-type channel-doped region 41h in the element region 41B and an n-type source extension region 45Cs and an n-type drain extension region 45Cd at opposing sides of the gate electrode 44C in the p-type channel-doped region 41f in the element region 41C.

Furthermore, boron fluoride (BF2) ions are implanted into the element regions 41A, 41D and 41E, for instance, at an acceleration voltage 20 keV with a dose of $1 \times 10^{14}$ ions/cm$^2$ by using the gate electrodes 44A, 44D and 44E as the masks. As a result, it is possible to form a p-type source extension region 45As and a p-type drain extension region 45Ad at opposing sides of the gate electrode 44A in the n-type channel-doped region 41k in the element region 41A, a p-type source extension region 45Ds and a p-type drain extension region 45Dd at opposing sides of the gate electrode 44D in the n-type channel-doped region 41j in the element region 41D, and a p-type source extension region 45Es and a p-type drain extension region 45Ed at opposing sides of the gate electrode 44E in the n-type channel-doped region 41b in the element region 41E.

Furthermore, a sidewall insulation film 47 is formed in each of the gate electrodes 44A through 44E according to a conventional technique, and then P ions are implanted into the element regions 41B and 41C, for instance, at an acceleration voltage 15 keV with a dose of $1\times10^{15}$ ions/cm$^2$ by using the gate electrodes 44B and 44C and the sidewall insulation films 47 as the masks. As a result, it is possible to form an n+-type source region 46BS and an n+-type drain region 46BD at opposing sides of the gate electrode 44B in the p-type channel-doped region 41h in the element region 41B and an n+-type source region 46CS and an n+-type drain region 46CD at opposing sides of the gate electrode 44C in the p-type channel-doped region 41f in the element region 41C.

Furthermore, B ions are implanted into the element regions 41A, 41D and 41E, for instance, at an acceleration voltage 15 keV with a dose of $1\times10^{15}$ ions/cm$^2$ by using the gate electrodes 44A, 44D and 44E and the sidewall insulation films 47 as the masks. As a result, it is possible to form a p+-type source region 46AS and a p+-type drain region 46AD at opposing sides of the gate electrode 44A in the n-type channel-doped region 41k in the element region 41A, a p+-type source region 46DS and a p+-type drain region 46DD at opposing sides of the gate electrode 44D in the n-type channel-doped region 41j in the element region 41D, and a p+-type source region 46ES and a p+-type drain region 46ED at both sides of the gate electrode 44E in the n-type channel-doped region 41b in the element region 41E.

Furthermore, the obtained structure is thermally processed, for instance, at a temperature of 1000° C. for 10 seconds in order to activate the implanted impurity element.

In a process in FIG. 5G, a CoSi film is sputtered on the structure in FIG. 5F such that the film thickness is 30 nm. Subsequently, if the CoSi film is thermally processed, for instance, at a temperature of 500° C. for 30 seconds, a low-resistance silicide film, which is not illustrated in FIG. 5G, is formed on each region of the gate electrodes 44A through 44E, the source regions 46AS through 46ES, and the drain regions 46AD through 46ED.

Then, after remaining CoSi films that have not be silicided are removed, an inter-layer insulation film 48 such as SiO$_2$ is formed on the above structure according to the plasma CVD (Chemical Vapor Deposition) method such that the film thickness becomes, for instance, 1 $\mu$m.

Furthermore, a contact hole is formed in the inter-layer insulation film 48 so as to expose the source region 46AS in the element region 41A, and then a bit line contact is formed in the contact hole. At the same time, contact plugs 49 corresponding to other source regions and drain regions are formed for each of the element regions 41B through 41E. If a bit line BL and a wiring pattern 50 are provided on the inter-layer insulation film 48, it is possible to obtain the desired semiconductor integrated circuit apparatus.

Such a semiconductor integrated circuit apparatus includes a CMOS element, which comprises an nMOS transistor in the element region 41B and a pMOS transistor in the element region 41D, in a high speed logic circuit part thereof.

In the semiconductor integrated circuit apparatus according to the third embodiment, since the threshold voltage of the planar capacitor in the element region 41A is reduced through the ion implantation into the diffusion region 41i, it is possible to select a driving voltage applied to the cell plate electrode 44F from a wider voltage range in order to obtain a desired capacitor performance. Also, the threshold is optimally controlled in a p-channel MOS transistor or an n-channel MOS transistor having a thin gate insulation film driven by a low voltage. Additionally, the threshold is optimally controlled in a p-channel MOS transistor or an n-channel MOS transistor having a thick gate insulation film driven by a high voltage.

Here, the threshold can be controlled without any additional process in the above-mentioned fabrication process.

The present invention is not limited to the specifically disclosed embodiments, and variations and modifications may be without departing from the scope of the present invention.

What is claimed is:

1. A semiconductor integrated circuit apparatus, comprising:

a substrate;

a first element region being formed on said substrate, said first element region having a first conductive type;

a second element region being formed on said substrate, said second element region having a second conductive type;

a third element region being formed on said substrate, said third element region having the second conductive type;

a first MOS transistor being formed in a transistor region of said first element region, said first MOS transistor having a second conductive type channel;

a capacitor being formed in a capacitor region of said first element region;

a second MOS transistor being formed on said second element region, said second MOS transistor having a first gate insulation film of a first film thickness and a first conductive type channel; and a third MOS transistor being formed on said third element region, said third MOS transistor having a second gate insulation film of a second film thickness greater than said first film thickness and the first conductive type channel, wherein said third MOS transistor has a channel region channel-doped under a first profile by using a second conductive type impurity element, said second MOS transistor has a channel region channel-doped under a second profile, which is a higher density profile, by using the second conductive type impurity element, and the second conductive type impurity element is imported in said capacitor region in the first element region under a profile substantially identical to a subtraction of a channel dope of said third MOS transistor from a channel dope of said second MOS transistor so as to form a diffusion region that serves as a lower electrode of said capacitor.

2. The semiconductor integrated circuit apparatus as claimed in claim 1, wherein said diffusion region has said first conductive type and a carrier density of said diffusion region is lower than a carrier density of said first element region.

3. The semiconductor integrated circuit apparatus as claimed in claim 1, wherein said second element region contains a fourth MOS transistor having a gate insulation film of said first film thickness and said first conductive type channel, and said third element region contains a fifth MOS transistor having a gate insulation film of said second film thickness and said first conductive type channel.

4. The semiconductor integrated circuit apparatus as claimed in claim 1, wherein said first MOS transistor is a p-channel MOS transistor.

5. The semiconductor integrated circuit apparatus as claimed in claim 1, wherein said capacitor includes a capacitor insulation film formed so as to cover said capacitor region and a capacitor electrode formed on said capacitor insulation film, and said capacitor insulation film has a film thickness substantially equal to said first film thickness of the first gate insulation film.

6. The semiconductor integrated circuit apparatus as claimed in claim 1, wherein said diffusion region, which serves as the lower electrode of said capacitor, has said first conductive type, and a carrier density of said diffusion region is lower than a carrier density of said channel region of the first MOS transistor.

7. The semiconductor integrated circuit apparatus as claimed in claim 1, wherein said first MOS transistor and said capacitor constitute a DRAM.

8. A semiconductor integrated circuit apparatus, comprising:
   a substrate;
   a first element region being on said substrate, said first element region having a first conductive type;
   a second element region being on said substrate, said second element region having the first conductive type;
   a third element region being on said substrate, said third element region having the first conductive type;
   a first MOS transistor being formed on a transistor region of said first element region, said first MOS transistor having a second conductive type channel;
   a capacitor being formed in a capacitor region of said first element region;
   a second MOS transistor being formed on said second element region, said second MOS transistor having a first gate insulation film of a first film thickness and the second conductive type channel; and
   a third MOS transistor being formed on said third element region, said third MOS transistor having a second gate insulation film of a second film thickness greater than said first film thickness and the second conductive type channel,
   wherein said third MOS transistor has a channel region channel-doped under a first profile by using a first conductive type impurity element, said second MOS transistor has a channel region channel-doped under a second profile, which is a higher density profile, by using the first conductive type impurity element, and the first conductive type impurity element is imported in said capacitor region in the first element region under a profile substantially identical to a channel dope of said third MOS transistor so as to form a diffusion region that serves as a lower electrode of said capacitor.

9. The semiconductor integrated circuit apparatus as claimed in claim 8, wherein said first MOS transistor is a p-channel MOS transistor.

10. The semiconductor integrated circuit apparatus as claimed in claim 8, wherein said capacitor includes a capacitor insulation film formed so as to cover said capacitor region and a capacitor electrode formed on said capacitor insulation film, and said capacitor insulation film has a film thickness substantially equal to said first film thickness of the first gate insulation film.

11. The semiconductor integrated circuit apparatus as claimed in claim 8, wherein said diffusion region, which serves as the lower electrode of said capacitor, has said first conductive type, and a carrier density of said diffusion region is lower than a carrier density of said channel region of the first MOS transistor.

12. The semiconductor integrated circuit apparatus as claimed in claim 8, wherein said first MOS transistor and said capacitor constitute a DRAM.

13. A fabrication method of a semiconductor integrated circuit apparatus comprising: a substrate; a first element region being formed on said substrate, said first element region having a first conductive type; a second element region being formed on said substrate, said second element region having a second conductive type; a third element region being formed on said substrate, said third element region having the second conductive type; a first MOS transistor being formed in a transistor region of said first element region, said first MOS transistor having a second conductive type channel; a capacitor being formed in a capacitor region of said first element region; a second MOS transistor being formed on said second element region, said second MOS transistor having a first gate insulation film of a first film thickness and a first conductive type channel; and a third MOS transistor being formed on said third element region, said third MOS transistor having a second gate insulation film of a second film thickness greater than said first film thickness and the first conductive type channel, the fabrication method comprising the steps of:
   importing a second conductive type impurity element in said second element region and said third element region selectively, and conducting a channel-doping for a channel region of said third MOS transistor;
   importing said second conductive type impurity element in said capacitor region in the first element region and said second element region, and conducting a channel-doping for a channel region of said second MOS transistor in the second element region and a diffusion region, which serves as a lower electrode of said capacitor, corresponding to said capacitor region in the first element region; and
   forming said first MOS transistor in said transistor region of the first element region, said capacitor in said capacitor region of the first element region, said second MOS transistor in said second element region, and said third MOS transistor in said third element region,
   wherein said step of forming said second MOS transistor includes a step of forming said first gate insulation film of said first film thickness, said step of forming said third MOS transistor includes said second gate insulation film of said second film thickness, said step of forming the diffusion region, which serves as the lower electrode in the capacitor region, in the first element region is performed simultaneously with said step of conducting a channel-doping for the channel region of said second MOS transistor in the second element region, and said second conductive type impurity element is imported in the second element region simultaneously with said step of conducting a channel-doping for the channel region of the third MOS transistor.

14. The fabrication method as claimed in claim 13, further comprising a step of importing a first conductive type impurity element in the first element region such that said first conductive type impurity element is not imported in said capacitor after the step of conducting a channel-doping for the channel region of the second MOS transistor before the step of forming the first through the third MOS transistors.

15. The fabrication method as claimed in claim 14, wherein said substrate further contains a fourth element region having the first conductive type, and said first conductive type impurity element is further imported in said fourth element region simultaneously with the step of importing said first conductive type impurity element in the first element region.

16. The fabrication method as claimed in claim 15, wherein said substrate further contains a fifth element region having the first conductive type, and said first conductive type impurity element is imported in the first, the fourth and the fifth element regions before the step of conducting a channel-doping for the channel region of the third MOS transistor.

17. The fabrication method as claimed in claim 13, wherein said first MOS transistor is a pMOS transistor in the first element region.

18. The fabrication method as claimed in claim 13, wherein said first MOS transistor and said capacitor constitute a DRAM in the first element region.

19. A fabrication method of a semiconductor integrated circuit apparatus comprising: a substrate; a first element region being on said substrate, said first element region having a first conductive type; a second element region being on said substrate, said second element region having the first conductive type; a third element region being on said substrate, said third element region having the first conductive type; a first MOS transistor being formed in a transistor region in said first element region, said first MOS transistor having a second conductive type channel; a capacitor being formed in a capacitor region in said first element region; a second MOS transistor being formed in said second element region, said second MOS transistor having a first gate insulation film of a first film thickness and the second conductive type channel; and a third MOS transistor being formed in said third element region, said third MOS transistor having a second gate insulation film of a second film thickness greater than said first film thickness and the second conductive type channel, the fabrication method comprising the steps of:

importing a first conductive type impurity element in the first, the second and the third element regions, forming a diffusion region, which serves as a lower electrode of said capacitor, in the first element region, and conducting a channel-doping for a channel region of the third MOS transistor in the third element region, said channel region having the first conductive type;

importing said first conductive type impurity element in said transistor region of the first element region and said second element region, and conducting a channel-doping for a channel region of the first MOS transistor in the transistor region and a channel region of the second MOS transistor in the second element region; and forming said first MOS transistor in the transistor region in the first element region, said capacitor in the capacitor region, said second MOS transistor in the second element region, and said third MOS transistor in the third element region, wherein said step of forming the second MOS transistor includes a step of forming said first gate insulation film of the first film thickness, said step of forming the third MOS transistor includes a step of forming said second gate insulation film of the second film thickness, said step of forming the diffusion region in the first element region is performed simultaneously with said step of conducting the channel-doping for the channel region of the third MOS transistor in the third element region, and said step of conducting the channel-doping for the channel region of the first MOS transistor in the first element region is performed simultaneously with said step of conducting the channel-doping for the channel region of the second MOS transistor in the second element region.

20. The fabrication method as claimed in claim 19, wherein said first MOS transistor is a pMOS transistor in the first element region.

21. The fabrication method as claimed in claim 19, wherein said first MOS transistor and said capacitor constitute a DRAM in the first element region.

22. A fabrication method of a semiconductor integrated circuit apparatus comprising: a substrate; a first element region being formed on said substrate, said first element region having a first conductive type; a second element region being formed on said substrate, said second element region having a second conductive type; a third element region being formed on said substrate, said third element region having the second conductive type; a fourth element region being formed on said substrate, said fourth element region having the first conductive type; a fifth element region being formed on said substrate, said fifth element region having the first conductive type; a first MOS transistor being formed in a transistor region in the first element region, said first MOS transistor having the second conductive type; a capacitor being formed in a capacitor region in the first element region; a second MOS transistor being formed in the second element region, said second MOS transistor having a first gate insulation film of a first film thickness and a first conductive type channel; a third MOS transistor being formed in the third element region, said third MOS transistor having a second gate insulation film of a second film thickness greater than said first film thickness and a first conductive type channel; a fourth MOS transistor being formed in the fourth element region, said fourth MOS transistor having a third gate insulation film of a third film thickness and a second conductive type channel; and a fifth MOS transistor being formed in the fifth element region, said fifth MOS transistor having a fourth gate insulation film of a fourth film thickness greater than said third film thickness and the second conductive type channel, the fabrication method comprising the steps of:

importing a first conductive type impurity element in the first, the fourth and the fifth element regions selectively, and forming a diffusion region, which serves as a lower electrode of said capacitor, in the capacitor region in the first element region, and conducting a channel-doping for a channel region of the fifth MOS transistor in the fifth element region, said channel region having a first conductive type;

importing a second conductive type impurity element in the second and the third element regions selectively, and conducting a channel-doping for a channel region of the third MOS transistor;

importing a first conductive type impurity element in said capacitor region in the first element region and said second element region selectively, and conducting a channel-doping for the diffusion region, which serves as the lower electrode of the capacitor, corresponding to the capacitor region in the first element region and the channel region of the second MOS transistor in the second element region;

importing a first conductive type impurity element in said transistor region of the first element region and said fourth element region, and conducting a channel-doping for a channel region of the first MOS transistor in the transistor region and a channel region of the fourth MOS transistor in the fourth element region; and forming said first MOS transistor in the transistor region in the first element region, said capacitor in the capacitor region, said second MOS transistor in the second element region, said third MOS transistor in the third element region, said fourth MOS transistor in the fourth element region, and said fifth MOS transistor in the fifth element region, wherein said step of forming the second MOS transistor includes a step of forming said first gate insulation film of said first film thickness, said step of forming the third MOS transistor includes a step of forming said second gate insulation film of said second film thickness, said step of forming the fourth MOS transistor includes a step of forming said third gate insulation film of said first film thickness, said step of forming the fifth MOS transistor includes a step of forming said fifth gate insulation film of said second film thickness, and said step of forming the diffusion region, which serves as the lower electrode of said capacitor, in the first element region is performed simultaneously with said step of conducting the channel-doping for the channel region of the fourth MOS transistor in the fourth element region.

* * * * *